(12) United States Patent
Ma et al.

(10) Patent No.: US 11,523,069 B2
(45) Date of Patent: Dec. 6, 2022

(54) NXM TERAHERTZ DETECTOR ARRAY IMAGING SYSTEM BASED ON A SCHOTTKY CONTACT RASTERIZATION STRUCTURE

(71) Applicant: Guangdong University of Technology, Guangzhou (CN)

(72) Inventors: Jianguo Ma, Guangzhou (CN); Shaohua Zhou, Guangzhou (CN)

(73) Assignee: Guangdong University of Technology, Guangzhou (CN)

(*) Notice: Subject to any disclaimer, the term of this patent is extended or adjusted under 35 U.S.C. 154(b) by 0 days.

(21) Appl. No.: 17/203,290

(22) Filed: Mar. 16, 2021

(65) Prior Publication Data
US 2022/0070390 A1 Mar. 3, 2022

(30) Foreign Application Priority Data
Sep. 3, 2020 (CN) .......................... 202010917421.6

(51) Int. Cl.
*H04N 5/33* (2006.01)
*G01J 1/42* (2006.01)
(Continued)

(52) U.S. Cl.
CPC ............... *H04N 5/332* (2013.01); *G01J 1/42* (2013.01); *G01J 1/44* (2013.01); *H01L 31/0232* (2013.01); *G01J 2001/446* (2013.01)

(58) Field of Classification Search
CPC .... H04N 5/332; G01J 1/42; G01J 1/44; G01J 2001/446; H01L 31/0232; H01L 31/02327; H01L 31/115
See application file for complete search history.

(56) References Cited

U.S. PATENT DOCUMENTS
2021/0041289 A1* 2/2021 Iimori ....................... G01J 1/44

FOREIGN PATENT DOCUMENTS
CN 109378354 A * 2/2019
CN 109541712 A * 3/2019 ............... G01V 8/10

OTHER PUBLICATIONS
R. Han, Y. Zhang, Y. Kim, D. Y. Kim, H. Shichijo and K. O. Kenneth, "Terahertz image sensors using CMOS Schottky barrier diodes," 2012 International SoC Design Conference (ISOCC), 2012, pp. 254-257, doi: 10.1109/ISOCC.2012.6407088. (Year: 2012).*

* cited by examiner

Primary Examiner — Thanh Luu
Assistant Examiner — Monica T Taba
(74) Attorney, Agent, or Firm — Yong Chen

(57) ABSTRACT

The present disclosure discloses an N×M terahertz detector array imaging system based on a Schottky contact rasterization structure. The rasterization is introduced into the Schottky barrier diode, so that the rasterized Schottky contact resonates with the terahertz waves, the plasma resonance effect is enhanced, and the detection sensitivity of the array unit can be further improved. Moreover, there is no need to use an antenna, which can effectively avoid the problems such as large loss of the on-chip antenna, low gain efficiency, and difficulty in verifying through DRC design rules; and the chip area is greatly reduced, which greatly reduces the production cost. Finally, by adjusting the rasterization structure parameters of the array detector unit during the design process, the detector array can realize monochromatic array imaging or multicolor array imaging, which provides a new solution for the realization of low-cost, high-performance terahertz array cameras and terahertz imagers.

6 Claims, 3 Drawing Sheets

(51) Int. Cl.
*G01J 1/44* (2006.01)
*H01L 31/0232* (2014.01)

NXM TERAHERTZ DETECTOR ARRAY IMAGING SYSTEM BASED ON A SCHOTTKY CONTACT RASTERIZATION STRUCTURE

CROSS-REFERENCE TO RELATED APPLICATIONS

The present application claims the priority of Chinese patent application No. 202010917421.6, filed on Sep. 3, 2020, which is hereby incorporated by reference in its entirety.

TECHNICAL FIELD

The present disclosure relates to the technical field of terahertz detectors, and in particular to an N×M terahertz detector array imaging system based on a Schottky contact grating structure.

TECHNICAL BACKGROUND

Terahertz waves are electromagnetic waves between microwaves and infrared light on the electromagnetic spectrum, and have a frequency of about 0.1 to 10 THz and a wavelength corresponding to 3 mm to 30 μm. The Terahertz technology is one of the frontiers and hotspots of information science and technology research. In recent years, it has attracted extensive attention from research institutions around the world. Developed countries such as the United States, Japan, and Europe have successively rated the terahertz technology as "the top ten technologies for changing the future world" and "the top ten strategic goals of the country's key technology", and invested heavily to consolidate their international status in the terahertz field. For example, the National Foundation (NSF), Defense Advanced Research Projects Agency (DARPA), National Aeronautics and Space Administration (NASA), Department of Energy (DOE), European Research Council (ERC), IBM, Boeing and Airbus and other government and large multinational companies continue to invest in the field of terahertz technology. In China, after the Xiangshan Conference in 2005, the terahertz technology is listed by the government as a key field and priority development theme.

At present, the focus of terahertz detection and imaging technology research is to improve the performance of radiation sources and detectors. Schottky barrier diodes have the advantages of fast speed, good nonlinear effects, ability to work at room temperature and easy integration, so they are often used as frequency mixer and detector diodes in terahertz detectors. The traditional terahertz detectors based on Schottky barrier diodes all use antennas to receive terahertz waves, and the antenna has low gain and large area in the terahertz band, resulting in poor performance and high cost of terahertz detectors, which seriously hinders the development of terahertz detection and imaging technology.

SUMMARY

An objective of the present disclosure is to overcome the shortcomings of the prior art and provide an N×M terahertz detector array imaging system based on a Schottky contact grating structure, which is intended to realize low-cost, high-performance terahertz detection and imaging.

In order to achieve the above objective, the technical solution provided by the present disclosure is:

An N×M terahertz detector array imaging system based on a Schottky contact grating structure, comprising a detector array composed of N×M detector units arranged vertically and horizontally, N row selection switches, M column selection switches, a detector and readout circuit test switch, and a readout circuit;

wherein each detector unit comprises a Schottky barrier diode (SBD) with a Schottky contact grating structure, a bias voltage Vb1, a bias resistor Rb1, a DC blocking capacitor C1, and an NMOSFET; and wherein an anode of the SBD with the Schottky contact grating_structure is separately connected to one end of the bias resistor Rb1 and one end of the DC blocking capacitor C1, and a cathode thereof is grounded;

the other end of the bias resistor Rb1 is connected to the bias voltage Vb1, and is used to supply power to the SBD with the Schottky contact grating structure;

the other end of the DC blocking capacitor C1 is connected to one end of a switch SEL, and the other end of the switch SEL is connected to a source of the NMOSFET;

a gate of the NMOSFET in each detector unit is connected to a column selection switch of a column where it is located;

a drain of the NMOSFET in each detector unit is connected to a row selection switch of a row where it is located; and the detector and readout circuit test switch is connected between the N row selection switches and the readout circuit.

Further, the SBD with the Schottky contact grating structure is an SBD in which a Schottky contact is converted into a grated structure, and has a grate-like trench.

Further, Schottky contact grating structure parameters of the SBD with the Schottky contact grating structure include a grating width, a grating length, a grating region area, a grating period, and a grating pattern form, and these parameters are used to realize single-frequency detection at any frequency point or realize that one detector unit supports detection of multiple different frequency points.

Further, the SBD with the Schottky contact grating structure is a Shallow Trench Separated SBD or Polysilicon-Gate Separated SBD.

Further, the readout circuit comprises a low-noise chopper amplifier and a high-resolution analog-to-digital converter; the low-noise chopper amplifier is connected between the N row selection switches and the high-resolution analog-to-digital converter, amplifies a received terahertz signal and uses chopper circuit technology to reduce the amplifier's own offset and 1/f noise; and the high-resolution analog-to-digital converter digitizes the amplified terahertz signal for back-end signal processing.

Further, the detector and readout circuit test switch comprises a detector test switch S1 and a readout circuit test switch S2; and the detector test switch S1 and the readout circuit test switch S2 are separately connected between the N row selection switches and the readout circuit.

Compared with the prior art, the principle and advantages of the present solution are as follows:

1. The grating is introduced into the Schottky barrier diode, so that the grated Schottky contact resonates with the terahertz waves, the plasma resonance effect is enhanced, and the detection sensitivity of the array unit can be further improved.

2. There is no need to use an antenna, which can effectively avoid the problems such as large loss of the on-chip antenna, low gain efficiency, and difficulty in verifying through DRC design rules; and the chip area is greatly reduced, which greatly reduces the production cost.

3. Under the premise that there is a terahertz source, by adjusting the grating structure parameters of the array detector unit during the design process, the detector array can realize monochromatic array imaging or multicolor array imaging, which provides a new solution for the realization of low-cost, high-performance terahertz array cameras and terahertz imagers.

4. The introduction of the detector and readout circuit test switch can test each detector unit and the readout circuit separately when the circuit fails so as to accurately determine the cause and location of the specific circuit failure.

5. The idea of the grating of the gate is proposed and it is combined with the Schottky barrier diode (SBD), and through a periodic SBD structure, a-grate-like trench is formed in the trench to realize the enhancement of resonance between plasmons in the substrate and plasmonic behavior in the gate; and the method of the grated gate can be used to reduce the problems such as weak terahertz signals in the space, weak plasmonic behavior excited by the metal structure on the gate, and diffusion and loss in the propagation process.

BRIEF DESCRIPTION OF THE DRAWINGS

In order to more clearly illustrate the technical solutions in embodiments of the present disclosure or the prior art, the measures that need to be used in the description of the embodiments or the prior art will be briefly described below. Obviously, the drawings in the following description are only some embodiments of the present disclosure, and other drawings can be obtained by those of ordinary skill in the art from these without creative efforts.

FIGS. 2A-2C show periodic Shoottky contact grating structures with different patterns; and FIG. 2D shows a non-periodic Shoottky contact grating structure.

DETAILED DESCRIPTION OF THE EMBODIMENTS

Figure 1:
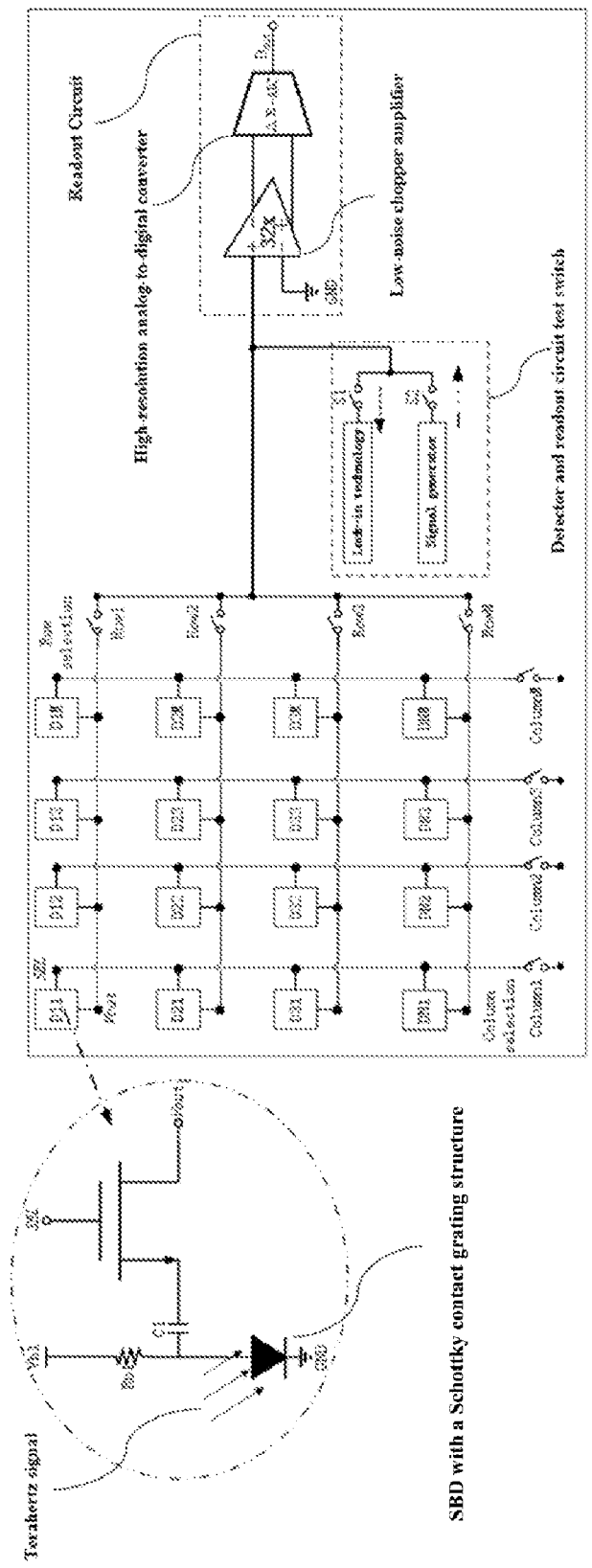
FIG. 1 is a schematic structural diagram of an N×M terahertz detector array imaging system based on a Schottky contact grating structure according to the present disclosure.
Figure 2A:
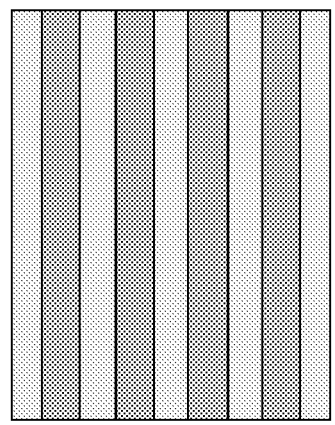
FIGS. 2A-2D show different Shoottky contact grating structures.
Figure 2B:
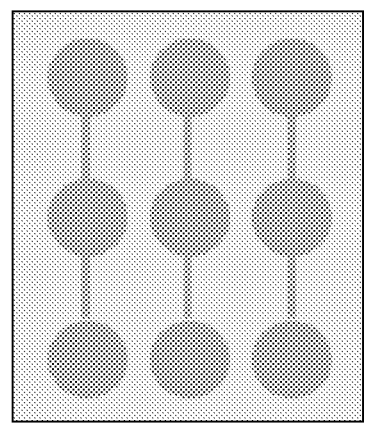
Figure 2C:
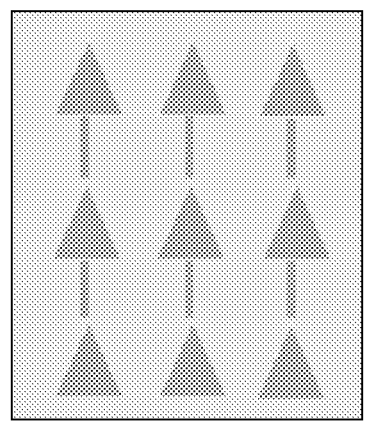
Figure 2D:
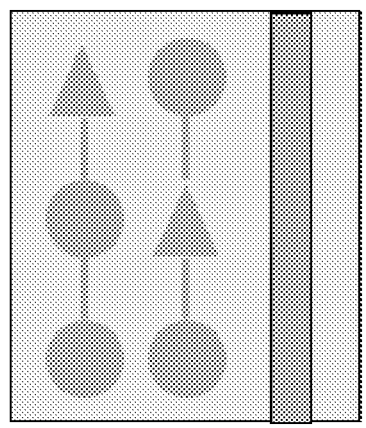

The present disclosure will be further described below in conjunction with specific embodiments:

As shown in FIG. 1, an N×M terahertz detector array imaging system based on a Schottky contact grating structure includes a detector array composed of N×M detector units (D11, D12, D13, . . . , DNM) arranged vertically and horizontally, N row selection switches (Row1, Row2, Row3, . . . , RowN), and M column selection switches (Column1, Column2, Column3, . . . , ColumnM), a detector and readout circuit test switch, and a readout circuit. Each detector unit comprises an SBD with a Schottky contact grating structure, a bias voltage Vb1, a bias resistor Rb1, a DC blocking capacitor C1, and an NMOSFET. FIGS. 2A-2D show different Shoottky contact grating structures; FIGS. 2A-2C show periodic Shoottky contact grating structures with different patterns; and FIG. 2D shows a non-periodic Shoottky contact grating structure.

An anode of the SBD with the Schottky contact grating structure is separately connected to one end of the bias resistor Rb1 and one end of the DC blocking capacitor C1, and a cathode thereof is grounded; the other end of the bias resistor Rb1 is connected to the bias voltage Vb1, and is used to supply power to the SBD with the Schottky contact grating structure; the other end of the DC blocking capacitor C1 is connected to one end of a switch S1, and the other end of the switch S1 is connected to a source of the NMOSFET; a gate of the NMOSFET in each detector unit is connected to a column selection switch of a column where it is located; a drain of the NMOSFET in each detector unit is connected to a row selection switch of a row where it is located; and the detector and readout circuit test switch is connected between the N row selection switches and the readout circuit.

Specifically, the SBD with the Schottky contact grating structure adopted in this embodiment is a Shallow Trench Separated (STS) SBD or Polysilicon-Gate Separated (PGS) SBD. The Shallow Trench Separated SBD or Polysilicon-Gate Separated SBD is an SBD in which the anode is converted into a grated structure, and has a grate-like trench. Parameters of the Schottky contact grating structure include a grating width, a grating length, a grating region area, a grating period, and a grating pattern form, so that under the premise that there is a terahertz source, the single-frequency detection at any frequency point or one detector unit supporting the detection of multiple different frequency points may be realized by adjusting the grating structure parameters according to actual needs.

Specifically, the above-mentioned readout circuit includes a low-noise chopper amplifier and a high-resolution analog-to-digital converter, wherein the low-noise chopper amplifier is connected between the N row selection switches and the high-resolution analog-to-digital converter, amplifies a received terahertz signal and uses chopper circuit technology to reduce the amplifier's own offset and 1/f noise; and the high-resolution analog-to-digital converter digitizes the amplified terahertz signal for back-end signal processing.

The detector and readout circuit test switch includes a detector test switch S1 and a readout circuit test switch S2; and the detector test switch S1 and the readout circuit test switch S2 are separately connected between the N row selection switches and the readout circuit. It is mainly convenient to test each detector unit (D11, D12, D13, . . . , DNM) and the readout circuit separately in the process of circuit failure, so as to determine the specific cause and location of the failure.

In this embodiment, the specific working process of the detector array imaging system is as follows:

When a row selection switch and a column selection switch of the array are closed (for example, a row selection switch Row2 and a column selection switch Column2 are closed), the detector test switch S1 is opened, and the readout circuit test switch S2 is opened, a terahertz signal received by the detector array is amplified by the low-noise chopper amplifier, then enters the high-resolution analog-to-digital converter for digital processing, and thereafter is output from Dout.

When a row selection switch and a column selection switch of the array are closed (for example, a row selection switch Row1 and a column selection switch Column1 are closed), the detector test switch S1 is closed, and the readout circuit test switch S2 is opened, the performance test of the detector unit is performed. If a terahertz signal can be received, then it indicates that the detector unit D11 is working normally, otherwise the detector unit D11 is malfunctioning.

When a row selection switch and a column selection switch of the array are opened (for example, a row selection switch Row1 and a column selection switch Column1 are opened), the detector test switch S1 is opened, and the readout circuit test switch S2 is closed, the performance test of the readout circuit is performed. If a signal digitized by the high-resolution analog-to-digital converter is normally outputted at $D_{out}$, then it indicates that the readout circuit is working normally, otherwise the readout circuit is malfunctioning.

In the N×M terahertz detector array imaging system described in this embodiment, the single-frequency detection at any frequency point or one detector unit supporting the detection of multiple different frequency points may be realized by adjusting the Schottky contact grating structure parameters (width, length, region area, period, and pattern form). Moreover, the grating is introduced into the Schottky barrier diode, so that the grated Schottky contact resonates with the terahertz waves, the plasma resonance effect is enhanced, and the detection sensitivity may be further improved. In addition, during the design process, by adjusting the grating structure parameters of the array detector unit, the detector array may realize monochromatic array imaging or multicolor array imaging, which provides a new solution for the realization of low-cost, high-performance terahertz cameras and terahertz imagers.

The embodiments described above are only exemplary embodiments of the present disclosure, and do not limit the scope of implementation of the present disclosure. Therefore, any changes made according to the shape and principle of the present disclosure should be covered by the scope of protection of the present disclosure.

What is claimed is:

1. An N×M terahertz detector array imaging system based on a Schottky contact grating structure, comprising a detector array composed of N×M detector units arranged vertically and horizontally, N row selection switches, M column selection switches, a detector and readout circuit test switch, and a readout circuit;
   wherein each detector unit comprises a Schottky barrier diode (SBD) with a Schottky contact grating structure, a bias voltage Vb1, a bias resistor Rb1, a DC blocking capacitor C1, and an NMOSFET; and
   wherein an anode of the SBD with the Schottky contact grating structure is separately connected to one end of the bias resistor Rb1 and one end of the DC blocking capacitor C1, and a cathode thereof is grounded;
   the other end of the bias resistor Rb1 is connected to the bias voltage Vb1, and is used to supply power to the SBD with the Schottky contact grating structure;
   the other end of the DC blocking capacitor C1 is connected to one end of a switch SEL, and the other end of the switch SEL is connected to a source of the NMOSFET;
   a gate of the NMOSFET in each detector unit is connected to a column selection switch of a column where it is located;
   a drain of the NMOSFET in each detector unit is connected to a row selection switch of a row where it is located; and
   the detector and readout circuit test switch is connected between the N row selection switches and the readout circuit.

2. The N×M terahertz detector array imaging system based on the Schottky contact grating structure according to claim 1, wherein the SBD with the Schottky contact grating structure is an SBD in which a Schottky contact is converted into a grated structure, and has a grate-like trench.

3. The N×M terahertz detector array imaging system based on the Schottky contact grating structure according to claim 2, wherein parameters of the Schottky contact grating structure include a grating width, a grating length, a grating region area, a grating period, and a grating pattern form, and these parameters are used to realize single-frequency detection at any frequency point or realize that one detector unit supports detection of multiple different frequency points.

4. The N×M terahertz detector array imaging system based on the Schottky contact grating structure according to claim 3, wherein the SBD with the Schottky contact grating structure is a Shallow Trench Separated SBD or Polysilicon-Gate Separated SBD.

5. The N×M terahertz detector array imaging system based on the Schottky contact grating structure according to claim 1, wherein the readout circuit comprises a low-noise chopper amplifier and a high-resolution analog-to-digital converter; the low-noise chopper amplifier is connected between the N row selection switches and the high-resolution analog-to-digital converter, amplifies a received terahertz signal and uses chopper circuit technology to reduce the amplifier's own offset and 1/f noise; and the high-resolution analog-to-digital converter digitizes the amplified terahertz signal for back-end signal processing.

6. The N×M terahertz detector array imaging system based on the Schottky contact grating structure according to claim 1, wherein the detector and readout circuit test switch comprises a detector test switch S1 and a readout circuit test switch S2; and the detector test switch S1 and the readout circuit test switch S2 are separately connected between the N row selection switches and the readout circuit.

\* \* \* \* \*